United States Patent [19]

Vogel

[11] 4,189,778
[45] Feb. 19, 1980

[54] METHOD AND INSTRUMENTATION FOR THE MEASUREMENT OF PARAMETERS OF SYSTEM DEVICES

[76] Inventor: Uriel Vogel, P.O. Box 408, Huntington, N.Y. 11743

[21] Appl. No.: 846,634

[22] Filed: Oct. 31, 1977

[51] Int. Cl.$^2$ ............................................ G01R 31/22
[52] U.S. Cl. ................................. 364/482; 324/57 R; 364/571; 364/579
[58] Field of Search ............................... 364/480–483, 364/604, 728, 823, 819, 571, 577, 579, 580; 324/29.5, 57 R, 62, 63; 320/35, 36

[56] References Cited

U.S. PATENT DOCUMENTS

| | | | |
|---|---|---|---|
| 2,950,437 | 8/1960 | Stahl | 364/580 |
| 3,818,331 | 6/1974 | Schlosser | 324/57 R |
| 4,039,945 | 8/1977 | Ugolnikov et al. | 324/57 R |

Primary Examiner—Errol A. Krass

[57] ABSTRACT

Method and instrumentation for the measurement and display of parameters of devices within operating systems where a multiplicity of parameters determine the characteristics of a device. Devices are excited by test signals independent of operating system signals and the responses to the test signals are detected and compared with stored device characteristics. The measurements are processed by searching for the best fit between the response of each device and the corresponding stored characteristics resulting in a set of parameters values that determines the state of the device. In cases where the response of a device depends largely on a single parameter processing simplifies to transformations of the measured responses and comparisons to stored calibration curves. Instrumentation is also disclosed that is particularly adapted for the measurement of the state of charge of batteries.

20 Claims, 11 Drawing Figures

METHOD AND INSTRUMENTATION FOR THE MEASUREMENT OF PARAMETERS OF SYSTEM DEVICES

BACKGROUND OF THE INVENTION

1. This invention relates to systems with a multiplicity of devices where there is a need to determine the states of the devices during regular operation or during partial or complete rest periods of the system. A particular application of this invention is the determination of the state of charge of batteries either incorporated in operating systems or as isolated units.

2. Modern systems with their high degree of complexity and sophistication have created the need for testing the condition or state of very many critical components to insure the proper, safe, operation and maintenance of the systems. Testing or Self Testing is, for example, applied in the wide area of digital electronics where automatic testing of systems with the aid of computers is widely used and also currently undergoing extensive developments. Another, more particular, example of the importance of testing is the case of systems incorporating transistors. These devices produce internal heat in addition to heat supplied by the hot environments in which they are usually operating. The internal temperatures of the transistors are therefore elevated and may reach levels beyond which permanent damage to a transistor would occur. It often becomes important, therefore, to measure the internal temperature of a transistor, known as the Junction Temperature in bipolar transistors. This is usually accomplished by measuring the transistor case temperature and by adding to it temperature increments calculated from known or measured internal power dissipations. This method is in many cases inaccurate and results in transistor failures that could be prevented if more precise knowledge of junction temperatures were available. Another example of a component critical to the operation of a system is a battery. The state of charge of system batteries should be known at all times so that a replacement or recharge operation could be undertaken in time to ensure against system failures. Knowledge of the state of charge should be accurate because this would allow the batteries to stay in use, reliably, longer and very close to a complete discharge, for example. This should increase the overall economy and efficiency of system operations and is a particularly important factor in the case of complex and expensive remote systems.

Several methods for measuring the state of charge of batteries have been described but all suffer either from lack of accuracy or the lack of flexibility in terms of integration into large systems. In many cases battery terminal voltage has been used to determine the state of charge. This method can, in principle, be integrated into a system by recording the electrical voltages of the system batteries but the resulting accuracy is mostly insufficient. Another method is described in U.S. Pat. No. 3,562,634 by Norman Latner and entitled: Method for Determining the State Of Charge of Nickel Cadmium Batteries By Measuring the Farad Capacitance Thereof. In that disclosure the capacitance between a nickel-cadmium battery electrode and electrolyte was measured electrically and used to determine the state of charge. Specific measurement conditions were disclosed that indicate the feasibility of that method but no instrumentation was disclosed that would enable the integration of the measurement method into operating systems. Battery temperature affects the measurement of electrode capacitance and this has not been discussed by Latner. Temperature effects come about mainly through the resistive components of the battery impedance through which the approximate capacitance can be determined. This is true in general for any battery including nickel-cadmium batteries. Another complicating factor is the fact that the equivalent circuit of battery impedance is not a simple lumped capacitance with resistive leads and leakage but rather a network of distributed capacitors, resistors and inductors. A simple or even a high quality impedance bridge measurement as disclosed by Latner can, therefore, not be made to produce a pure capacitance value corresponding to the state of charge. The particular problem involved with the determination of battery temperature is the fact that the internal, effective, electrode and electrolyte temperature has to be measured. This can be done under special, laboratory, conditions where the battery is in thermal equilibrium i.e. without internal heat dissipation. This is never the case in practice where heat flow and internal dissipation are always present. The effective temperature, therefore, not be measured directly. Another example of this problem is the case of a transistor where internal heat dissipation raises the junction temperature by an amount that cannot be measured directly. In this case terminal impedance can be represented by the transistor transconductance or by the base to collector current gain factor, for example. This, generalized, impedance is a function of the junction temperature and additional electrical parameters such as the base and collector currents. The above impedance is also a function of frequency and becomes a particularly complex function of all the above parameters at certain high frequencies. Generalized impedance, then, contains information on many of a device's parameters. Measurement of impedances lends itself also to integration in large systems. However, the extraction of information, from the measurement, on individual parameters is generally a complex problem that has not found, in the prior art, an adequate solution.

BRIEF SUMMARY OF THE INVENTION

It is an object of this invention to provide a method and instrumentation for measuring and processing generalized device impedances. Measurements are made in a range of frequencies and an impedance function is obtained. An operator is then applied to the measured impedances to obtain characteristic numbers. Such an operator may be a correlation of the measured impedances with a characteristic impedance of known device parameter values. This process is repeated with different known sets of device parameters until the best correlation, i.e. the best fit, is found between the measurement and a characteristic impedance of known parameter values. These values are then assigned to the measured device impedance thereby defining the state of the device. The best mode, in general, of implementing the above is with the aid of a computer where the characteristic impedances or functions with their corresponding parameter values can be stored and processed with measurement data. It is also an object of this invention to provide many modes of operation and flexibility in application for large systems as well as for small ones. The computer serves as a control and processing element. It also serves as a storage device for characteristic functions and parameter values for all devices in the system. Storage is also provided as a control means where different measurements and intermediate processing results are stored to provide the best efficiency of operation for the entire system. Digital computers of various architectures can be applied to this invention. Special types of computers and electronic circuits can also be used. It is therefore another object of this invention to provide circuit elements that can be integrated into a device parameter measuring system. A preferred embodiment is disclosed introducing new circuit features designed to increase the sensitivity of impedance measurement. These circuits are particularly adapted to operate in the presence of foreign, unrelated, signals such as occur in the system containing the devices as elements. New circuits are also disclosed for the compensation of empirical device characteristics so that a preferred response most directly related to the parameter being measured is obtained. Another object of this invention is to provide instrumentation for the measurement of single or isolated device parameters when other parameters are either obtainable by other, concurrent, measurements or that they do not influence the main measurement. A practical, useful, application is the measurement of state of charge of a battery. Another example is the measurement of the junction temperature of a transistor.

The above and further novel features and objects of this invention will appear more fully from the following description and claims when read in connection with the accompanying drawings.

DESCRIPTION OF THE PREFERRED EMBODIMENTS

Figure 1:
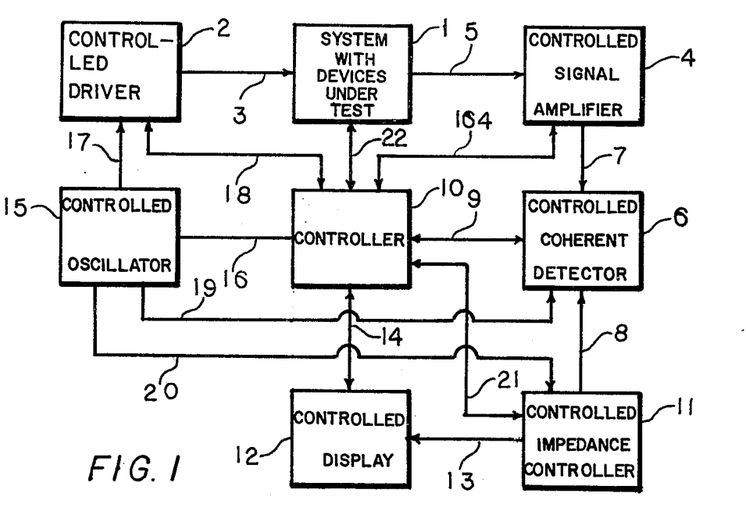
FIG. 1 is a schematic diagram of instrumentation for the measurement of parameters of system devices.

Referring to FIG. 1 a system with devices under test 1 is supplied signals from driver 2 through lines 3. Lines 3 may comprise several channels supplying test signals to each individual device in system 1 or may comprise a channel with time multiplexed signals directed in turn to each device. The above test signals excite a response signal corresponding to a device's impedance. The response is fed to a controlled signal amplifier 4 through lines 5 which may be similar to lines 3. The outputs of the controlled signal amplifier are fed to controlled coherent detector 6 through lines 7 similar to lines 3. Signals of a type equivalent (explained below) to the response signals in lines 7 are also fed to controlled coherent detector 6 through lines 8 similar to lines 7. The outputs of controlled coherent detector 6 are equivalently affected by corresponding inputs in lines 7 and 8. The above outputs of controlled coherent detector 6 are fed through lines 9 to controller 10. Lines 9 transmit also control signals from controller 10 to controlled coherent detector 6 either in separate physical lines or through the same lines by multiplexing. The signals in lines 8 are generated by controlled impedance controller 11 and effect controlled coherent detector so that its outputs in lines 9 are cancelled when corresponding signals, or their equivalents, in lines 7 and 8 are equal. Signals equal to, or advantageous functions of, the outputs in lines 8 are fed to controlled display 12 through lines 13. Since the signals in lines 13 are equivalent to the response signals of controlled signal amplifier 4 outputs which are equivalent to device impedances the controlled display 12 receives through lines 13 device impedance values or advantageous functions thereof. These impedance values are fed to controller 10 through lines 14 and after processing are returned through lines 14 to controlled display 12 for suitable display and transmission to remote receivers. The frequency range of impedance measurements is controlled by controller 10 that sends the required control signals to controlled oscillator 15 through lines 16. Controlled oscillator 15 supplies input signals, at the required frequencies, to controlled driver 2 through lines 17. The levels of the output signals of controlled driver 2 (on lines 3) are controlled by controller 10 through lines 18. Controlled driver 2 and the above controls serve also to hold the above levels constant, when needed, so that the resulting response in lines 5 would accurately represent device impedances. Controlled oscillator 15 sends reference signals to controlled coherent detector 6 through lines 19 and to controlled impedance controller 11 through lines 20. The phases of the above signals with respect to the phases of the corresponding signals in lines 17 are set so that particular impedance components can be measured. The phases may also be controlled by controller 10 through lines 16. When the resistive component of the impedance is measured, for example, the phase between the signals in line 19 may be set equal to the phase in line 3. The controlled coherent detector 6 would then respond to the resistive component of the device impedance. When the reactive component of impedance is measured the above relative phase may be 90°. Control of the above phases serves also to compensate for signal phase deviations such as those produced in controlled driver 2 and in controlled signal amplifier 4. information on the above deviations as functions of frequency may be stored in the controller 10 memory and applied for the above compensations through lines 16. The phases in lines 20 have to track those of lines 19 so that the outputs of controlled impedance controller 11 on lines 8 would correspond to the particular impedance components being measured. Controller 10 receives the controlled coherent detector 6 outputs on lines 9 and feeds back correction signals on lines 21 to null the outputs on lines 9. The corresponding signals on lines 7 and 8 thus become equivalent. Controller 10 comprises a computer that receives signals equivalent to device impedances from controlled impedance controller 11 and controlled display 12. These signals are stored in memory and processed to obtain the desired values of device parameters. The above processing can be described as follows. Measured values of device impedances with their corresponding frequency values represent a function in the form of sets of 2 numbers $Z_i$, $F_i$ where $Z_i$ is a measured impedance, $F_i$ is the corresponding frequency and i is an index representing a measurement number. If 10 measurements are taken, for example, i runs from 1 to 10, i.e. 10 sets of values $Z_i$, $F_i$ are stored. The above measured values represent the function $Z_\alpha = Z_\alpha(F) = Z(F, \alpha_j)$ where $\alpha_j$ represent a set of parameters, defining the state of the device, such as temperature, state of charge, pressure, etc. The above memory stores also a fixed set of functions $Z_\beta = Z_\beta(F)$ where $\beta$ represents particular sets of parameters. Any $Z_\beta(F)$ is therefore a characteristic function of the device under test. The process of finding the set of parameters that corresponds to the measured function $Z_\alpha$ may proceed by calculating the numbers $C_{\alpha\beta} = \int Z_\alpha Z_\beta dF / \sqrt{\int Z_\alpha^2 dF \int Z_\beta^2 dF}$ or correlation values. When $\alpha \neq \beta$, $Z_\alpha^2 dF \int Z_\beta^2 dF$ or correlation values. When $\alpha \neq \beta$, $C_{\alpha\beta} < 1$ and only when $\alpha = \beta$, $C_{\alpha\beta} = 1$. This property may now be utilized by letting the computer calculate successive values $C_{\alpha\beta}$ for different sets $\beta$ and search for the set corresponding to the maximum value $C_{\alpha\beta max} = C_{\alpha\gamma}$ where $\gamma = B_{max}$ represent the set of parameters with maximum value of $C_{\alpha\gamma}$ which should satisfy $C_{\alpha\gamma} \lesssim 1$. It can be concluded that $\alpha \approx \gamma$, i.e. the set of parameters corresponding to the state of the measured device has been determined. The processing has resulted in the desired values of the device parameters which may be stored in memory for subsequent use and/or transmitted to controlled display 12 for display and further transmission. The above obtained parameter values are approximate and approach the true values best when the stored functions $Z_\beta$ have the highest density in the $\beta$ space in the neighborhood of the point $\gamma$. The achievement of a high accuracy over a wide range of parameters may therefore require a very large number of stored functions $Z_\beta$ and consequently also large blocks of memory. This may not be desirable in some cases. Tradeoffs may then be made between memory locations and computing time by employing interpolation routines to achieve the required accuracies. A process with an interpolation routine may be as follows. A search for $C_{\alpha\gamma} \approx 1$ is made, as described above, with an acceptably low density of stored functions $Z_\beta$. The number $C_{\alpha\gamma}$ is a function of the point $\alpha$ and $C_{\alpha\gamma max} \lesssim C_{\gamma\gamma} = 1$. $C_{\alpha\gamma}$ can therefore be represented in a second order expression $$C_{\alpha\gamma} = 1 - \sum_{i=1}^{N} \sum_{j=1}^{N} K_{ij}(\alpha_i - \gamma_i)(\alpha_j - \gamma_j)$$

where $\alpha_i$, $\alpha_j$, $\gamma_i$, $\gamma_j$ are parameters with indices i and j respectively and N is the total number of parameters defining the state of the device. A linear transformation with a known matrix $T_{ij}$ can be found where $$C_{\alpha\gamma} = 1 - \sum_{i=1}^{N} K_i'(\alpha_i' - \gamma_i')^2 \text{ and} \qquad (A)$$

$$\alpha_i = \sum_{j=1}^{N} T_{ij}\alpha_j' \text{ and } \gamma_i = \sum_{j=1}^{N} T_{ij}\gamma_j' \qquad (B)$$

where $K_i' > 0$. The above expression for $C_{\alpha\gamma}$ can be changed to $$\sum_{i=1}^{N} K_i'(\alpha_i'^2 - 2\alpha_i'\gamma_i') = 1 - C_{\alpha\gamma} - \sum_{i=1}^{N} K_i'\gamma_i'^2 = D_\gamma.$$

This equation for the point $\alpha_i$ can be repeated for $N+1$ points $\beta_K$ where $\beta_K \approx \gamma$ and $1 \leq K \leq N+1$. A set of $N+1$ equations can now be written $$\sum_{i=1}^{N} K_i'\alpha_i'^2 - 2\sum_{i=1}^{N} K_i'\alpha_i'\beta_{ki}' = D_{\beta k} \qquad (C)$$

where $K_i'$ is a suitably intermediate value for the group of $N+1$ points $\beta_K$. By subtracting the $N+1$ equations (C) from each other N linear equations are obtained.

$$\sum_{i=1}^{N} K_i'(\beta_{Li}' - \beta_{Mi}')\alpha_i' = \frac{1}{2}(D_{\beta M} - D_{\beta L}) = E_\beta. \qquad (D)$$

Equations (D) are N linear equations with N unknown $\alpha_i'$. A linear equations solving routine provides the values $\alpha_i'$ insertion of which in equations (B) provides the measured device parameter values $\alpha_i$. To recapitulate, the above computer processing calculates values of $C_{\alpha\beta}$ and searches for $N+1$ largest values $C_{\alpha\beta}$ in the neighborhood of $\gamma$. Coeficients of equations (D) are then calculated from $C_{\alpha\beta K}$ and from stored coeficients of equations (A), (B) and (C). A linear equations solving routine then calculates the values $\alpha_i'$ from which the device parameter values $\alpha_i$ are calculated according to equation (B). The above number $N+1$ was the exact number of points needed to solve for N parameters. Additional points can be used to compute additional sets of approximate parameter values. Regression can then be applied to find a characteristic function $Z_\beta$ closer to $Z_\alpha$ and hence a set of patameters closer to the actual ones of the device.

The controller 10 computer serves also control functions as described above. These functions, in addition are for steering signals to different devices under test and between elements of the measurement instrumentation according to an advantageous multiplexing scheme. The control lines through which the above functions are carried out are, in addition to the lines mentioned above, lines 22 and 164. Many variations in the above control functions are possible which serves the object of making this invention suitable for integration into a very wide range of systems with devices under test 1. Controller 10 may comprise a dedicated computer or it may employ an external remote computer system. It may also employ computer included in the system with devices under test 1. The flexibility inherent in this invention can be further demonstrated by considering a useful embodiment suited for the measurement of a single device.

Figure 2:
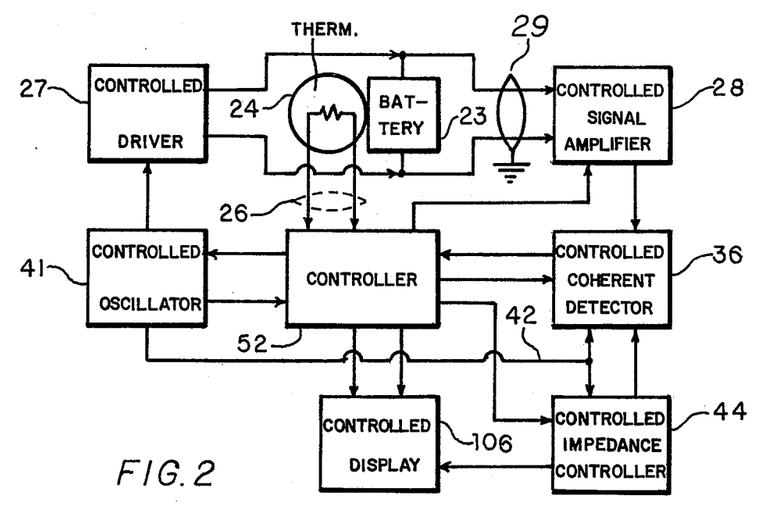
FIG. 2 is a schematic diagram of instrumentation for the measurement of the state of charge of a battery.

An example of the measurement of the state of charge of a battery 23 is shown in FIG. 2. Battery temperature has a strong influence on battery properties including terminal impedance. Temperature is therefore measured by a thermistor thermometer 24. The now known temperature values transmitted to controller 52 through line 26 are used in the processing of measured impedances to eliminate temperature effects on the measurement of the state of charge. The device under test, i.e. the battery, therefore becomes effectively a device with a single parameter—the state of charge. This, in practice, would be suitable for the measurement of isolated batteries or batteries with sufficiently low internal dissipation so that internal temperature increments can be neglected. Measurement of battery current may be added to the processing of the resistive component of battery impedance (being measured) and in this way eliminate the effects of internal temperature increments. The reduction of the number of parameters to One serves the useful purpose of simplifying the measurement instrumentation. It serves also to show that in this invention measurements other than, and in addition to, impedance measurements can be used to advantageously produce the desired results.

Figure 3:
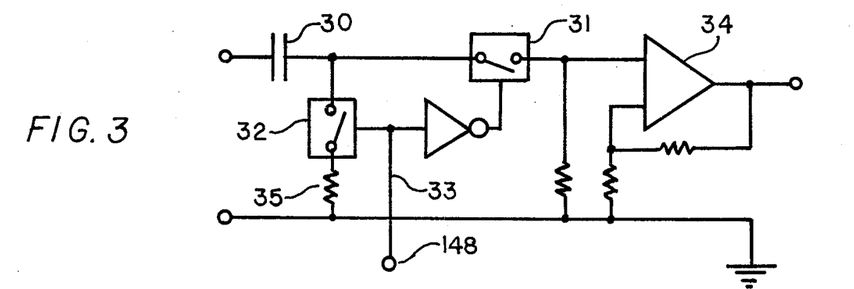
FIG. 3 is a circuit diagram of a controlled signal amplifier.

With reference to FIG. 2 controlled driver 27 transmits a regulated current into battery 23. The corresponding voltage, excited by the above current, is transmitted to controlled signal amplifier 28 through shielded line 29. A circuit diagram of controlled signal amplifier 28 is shown in FIG. 3 where a capacitor 30 blocks the dc battery voltage from being transmitted. The signal from the device under test flows through two mutually exclusive switches 31 and 32 controlled through line 33. When switch 31 is closed the signal is amplified by amplifier 34. When switch 32 is closed the signal is merely dissipated in resistor 35 and switch 32 so as to maintain the same loading of the controlled signal amplifier 28 (FIG. 2) input on the circuit of battery 23 (FIG. 2). Switches 31 and 32 are controlled essentially so that signal amplification takes place part of the time and another part of the time is used to perform other functions such as automatic error corrections details of which will become evident upon further reading of this specification. The output of amplifier 34 is fed to controlled coherent detector 36 (FIG. 2) a circuit diagram of which is shown in FIG. 4.

Figure 4:
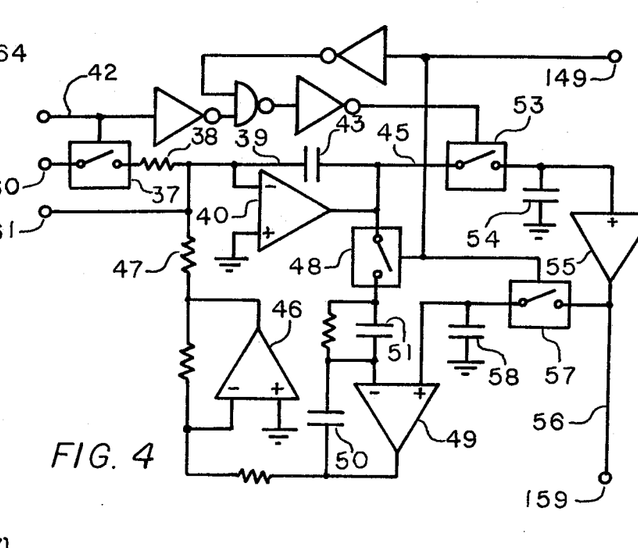
FIG. 4 is a circuit diagram of a controlled coherent detector.

With reference to FIG. 4 the signal from controlled signal amplifier 28 (FIG. 2) flows through switch 37 and resistor 38 into a virtual ground input 39 of amplifier 40. Switch 37 is activated by a signal from oscillator 41 (FIG. 2) through a line 42 (FIG. 2). This performs synchronous detection of the signal since the switching frequency is the same as the signal frequency. If the phase of the switching signal in line 42 (FIG. 2) is the same as the phase of the output signal of controlled driver 27 (FIG. 2) the average current flowing into input 39 is an analog of the resistive component of the device impedance. Similarly if the difference between the above phases is 90° the above average current is an analog of the reactive component of the device impedance. Amplifier 40 is connected with capacitor 43 as an integrator of the sum of the currents flowing into input 39. Another current flowing into input 39 comes from impedance controller 44 (FIG. 2). The sum of the controlled signal amplifier 28 (FIG. 2) current and the controlled impedance controller 44 (FIG. 2) current is integrated and appears as a voltage at point 45. If the above currents are equal in magnitude and opposite in sign the voltage at point 45 stays constant. This ignores leakage currents such as amplifier 40 input currents. To increase the resolution and accuracy of the cohernt detection function an additional current is supplied to input 39. This current compensates essentially for the input current to amplifier 40 and for any leakage not originating in the sum of the controlled signal amplifier 28 (FIG. 2) output and the controlled impedance controller 44 (FIG. 2) output. The above compensating current is supplied from the output of an amplifier 46 through resistor 47. Amplifier 46 is in the path of a feedback loop comprising amplifier 46, integrating amplifier 40, switch 48, amplifier 49 with integrating capacitor 50 and stabilizing capacitor 51. The above loop serves as an automatic leakage compensator. The operation of the above compensator is activated by switch 48 when signal is not flowing into the input of amplifier 34 (FIG. 3) through switch 31 (FIG. 3). For this purpose switch 48 is controlled by the same signal supplying line 33 (FIG. 3). During the above part of the time there is also no current flowing from controlled impedance controller 44 (FIG. 2), as will become evident subsequently, and the integrator capacitor 43 is charged by leakage currents and by the current through resistor 47. The above loop has sufficient negtive feedback gain to bring the voltage at point 45 to a steady state quickly. At this state the current through resistor 47 compensates exactly for the leakage currents resulting in a net zero current into input 39. The above steady state is maintained until switch 48 is opened. It is maintained beyond that time by integrating amplifier 49 and capacitor 50. The net result is a detection integrator comprising amplifier 40 and capacitor 43 with an effective zero leakage current. The utility of this circuit is that during the time signal flows integration with a relatively small capacitor 43 yields high detection sensitivity and a large integrating capacitor 50 ensures steady leakage compensation. The output voltage at point 45 is transmitted to controller 52 (FIG. 2) through a sample and hold combination comprising a switch 53, a capacitor 54, an amplifier 55 and a line 56. The output of amplifier 55 at line 56 is supplied to a sample and hold circuit comprising switch 57 and capacitor 58. The voltage across capacitor 58 is a copy of the voltage at line 56 and serves as a reference for feedback amplifier 49. This ensures that the detector output at point 45 can maintain different dc voltages while the leakage compensation feedback loop maintains the required compensation independent of the above voltage at point 45. The need for the above arises from the fact that the output of the detector is itself within a dc feedback loop. This will become evident upon further reading of this specification. Switch 57 is activated and deactivated together with switch 48. This results in a steady output at line 56 while signal currents flow into the detector. At this time the output at point 45 may vary when the sum of signal currents is not exactly zero. When the above signals are switched off the newly acquired voltage level at point 45 is transmitted to the output at line 56. Any changes of voltage at point 45 are thus transmitted to the output of controlled coherent detector 36 (FIG. 2) at line 56. Switch 53 is activated when switches 48 and 57 are deactivated but is also deactivated when coherent detector switch 37 is activated. This serves the purpose of refreshing the voltage across capacitor 54 when no signal is flowing into the detector and the voltage at point 45 is steady.

Figure 5:
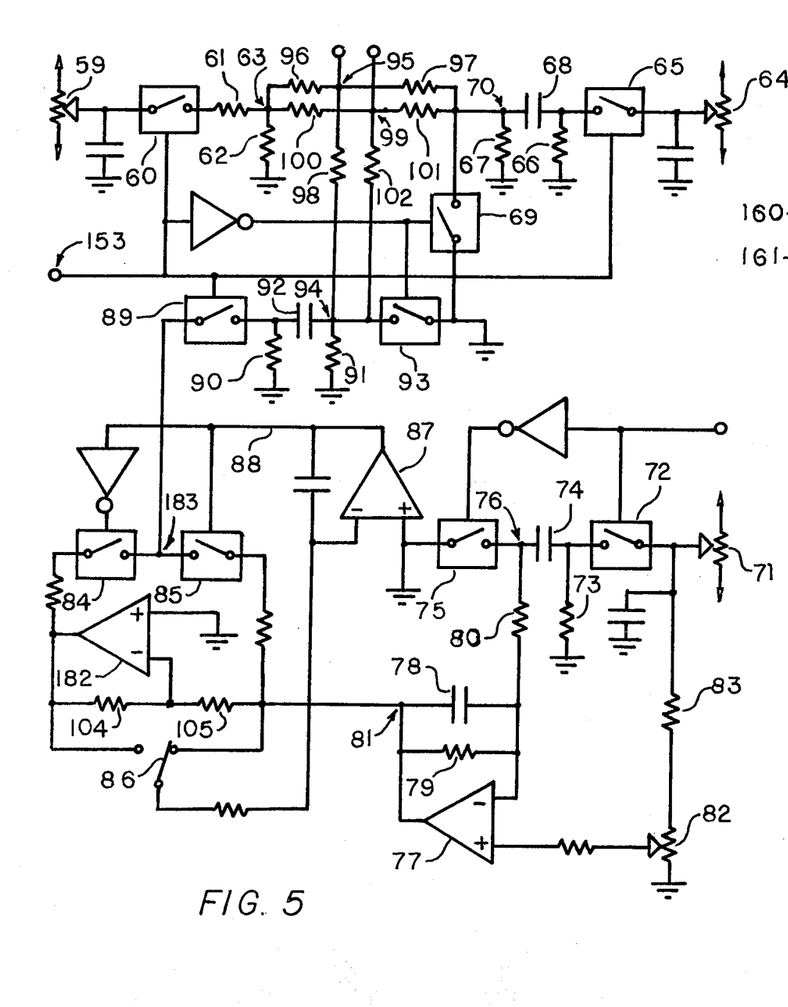
FIG. 5 is a circuit diagram of a controlled impedance controller.
Figures 6, 8, 9:
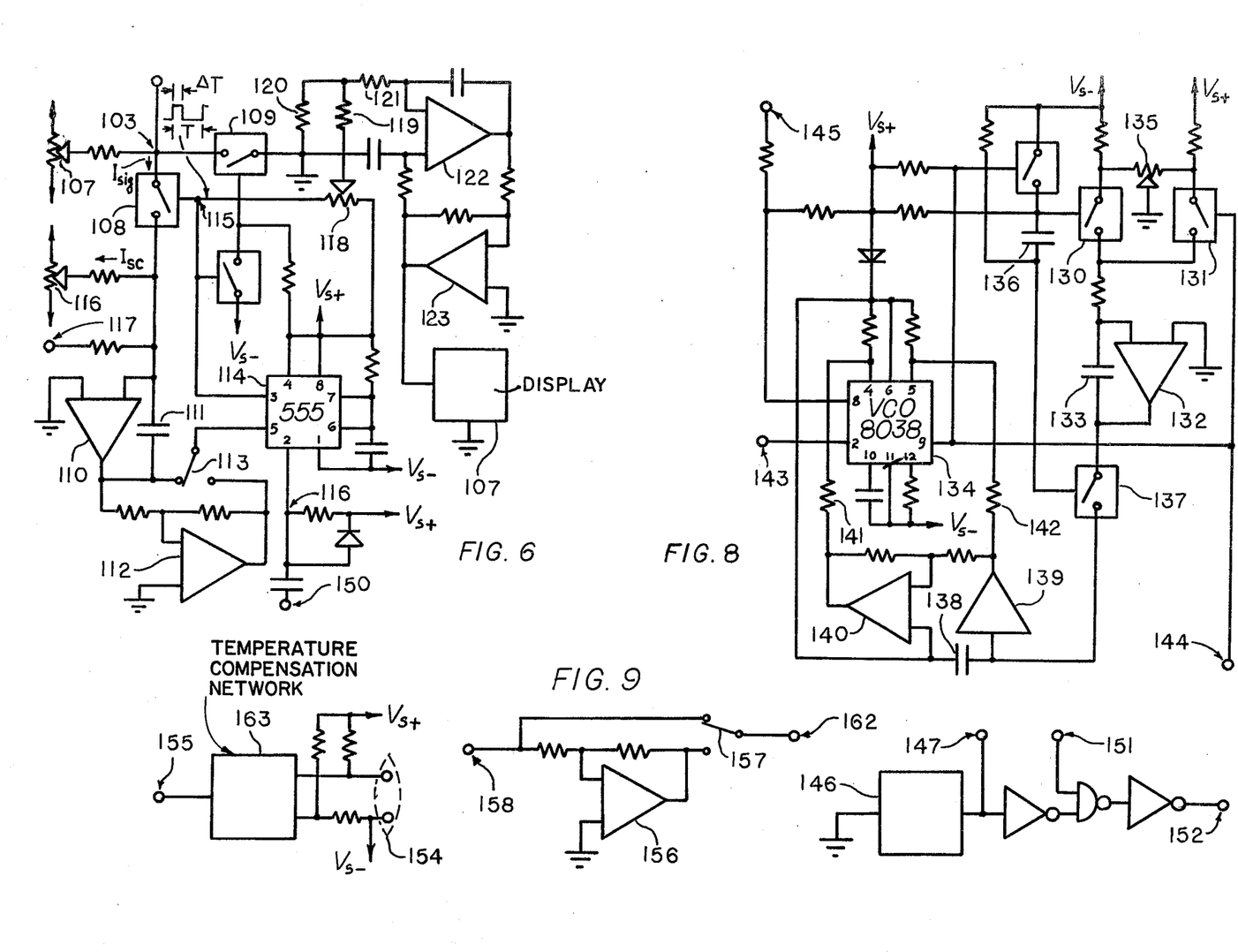
FIG. 6 is a circuit diagram of a controlled display.
FIG. 8 is a circuit diagram of a controlled oscillator.
FIG. 9 is a circuit diagram of a controller.

A circuit diagram of controlled impedance controller 44 (FIG. 2) is shown in FIG. 5. The main object of this circuit is to supply compensating currents to the coherent detector where the dependence of these currents on frequency may be controlled over a wide range. The utility of this control will become evident upon further reading of this specification and is partially needed to compensate for leakage signals at the signal frequencies (controlled oscillator 41 (FIG. 2) frequencies) that penetrate the coherent detection process. The above dependence may be expressed as an expansion series in powers of frequency with controllable coefficients. A zeroth order term of the above expansion is implemented in the circuit by potentiometer 59, switch 60 and resistors 61,62. Switch 60 is activated when signals are flowing through switch 31 (FIG. 3) and through the coherent detector switch 37 (FIG. 4). The signal appearing at junction 63 of resistors 61 and 62 is therefore a square wave whose average value is controlable by potentiometer 59. A first order term of the above expansion is implemented in the present circuit by potentiometer 64, switch 65, resistors 66 and 67, capacitor 68 and switch 69. Switch 65 is activated by the same signal as switch 60 and switch 69 is activated by the inverted signal. This results in exponential spikes at junction 70 whose time constant is made small compared to the controlled oscillator 41 FIG. 2) oscillation period. For any given setting of potentiometer 64, therefore, a fixed amount of charge is supplied by capacitor 68 resistor 67 resulting in an average signal level at junction 70 proportional to frequency. The level of this first order signal is controlled by potentiometer 64. A second order term is partially implemented in the present circuit by potentiometer 71, switch 72, resistor 73, capacitor 74 and switch 75. This part of the circuit is a first order term genetator as described above and results in a first order signal at junction 76. A difference between the above two first order term generators is that in the present generator the switches are controlled by an uninterupted signal from controlled oscillator 41 (FIG. 2). The signal at junction 76 is averaged by a lowpass active filter comprising amplifier 77, capacitor 78 and resistors 79 and 80. The output of this part of the circuit at junction 81 is essentially a dc voltage that varies linearly with frequency. The frequency at which the above voltage is zero depends on the setting of potentiometer 82. This potentiometer supplies a reference voltage to amplifier 77 through the divider network of resistor 83 and potentiometer 82. This configuration makes the frequency of zero output at junction 81 essentially independent of the setting of potentiometer 71, i.e. essentially independent of the coeficient of the present first order term generator. Further implementation of the second order term proceeds with an inverter amplifier supplying junction 83 through two mutually exclusive switches 84 and 85. The polarity of the signal at junction 83 is determined by the position of switch 86. This can be seen by considering first the circuit with switch 86 position as shown in FIG. 5. The signal at junction 81 is transmitted to comparator amplifier 87 resulting in a negative saturation voltage at junction 88 when the voltage at junction 81 is positive and a positive saturation voltage at junction 88 when the voltage at junction 81 is negative. It follows that switch 84 is closed when the voltage at junction 81 is positive and that the voltage at junction 183 is negative. When the voltage at junction 81 is negative switch 85 closes and the voltage at junction 183 is negative again. The magnitude of the voltage at junction 183 corresponds to the magnitude of the voltage at junction 81 but is always negative. It therefore corresponds to minus the absolute value of the voltage at junction 81. When the position of switch 86 is changed the same reasoning as above leads to the conclusion that the voltage at junction 183 corresponds to the absolute value of the voltage at junction 81. The voltage at junction 183 is fed to a first order term generator comprising switch 89, resistors 90 and 91, capacitor 92 and switch 93. The signals controlling switches 89 and 93 are the same as those controlling switches 65 and 69 respectively and the result is a second order signal mixed with a first order signal at junction 94. The frequency at which the voltage at junction 81 is zero has the highest curvature. In the circuit as shown the above curvature is virtually infinite except when potentiometer 82 is adjusted so that the voltage at junction 81 is zero at frequency zero. In this case the output signal at junction 94 is a pure second order term with origin at zero frequency. To obtain a pure second order term with origin at any frequency an adjustable zeroth order term generator fed from junction 83 is the now obvious only required addition to the circuit shown in FIG. 5. The signals of the 3 power term generators described above are summed at junction 95 through resistors 96, 97 and 98 and at junction 99 through resistors 100, 101 and 102. Junction 95 is connected to controlled coherent detector 36 (FIG. 2) at junction 39, i.e. at terminal 161, (FIG. 4) and junction 99 is connected to controlled display 106 (FIG. 2) at junction 103 (FIG. 6). The controlled impedance controller 44 (FIG. 2) circuits present great flexibility of control and are considerably more potent than the mere analog of the mathematical expansion in 3 terms. Sharp bends and asymmetric bends are easily attainable and are very useful when highly irregular, empirical, characteristic functions of device impedances have to be transformed into well behaved, regular, and possibly linear functions. This will become apparent in greater detail upon further reading of this specification. It may, however, be remarked that asymmetric bends can be implemented in the circuit of FIG. 5 by the relative adjustment of resistors 104 and 105. Also, the level controls 59, 64 and 71 and control 82 may be replaced by control signals from controller 52 (FIG. 2).

A circuit diagram of controlled display 106 (FIG. 2) is shown in FIG. 6 where the controlled impedance controller 44 (FIG. 2) output is fed to junction 103. The main object of this circuit is to transform the controlled impedance controller 44 (FIG. 2) output which is equivalent to device impedance and feed the transformed signal to a display 107. In the present case of a battery as the device under test the impedance component being measured is advantageously the reactive component since the reactance is largely an inverse function of the state of charge. It follows that when the battery is completely discharged the reactance and its equivalent controlled impedance controller 44 (FIG. 2) output should be essentially infinite. The display indication at that point should reasonably be zero. It is therefore a further object of this circuit to apply an inverse transformation to the controlled impedance controller 44 (FIG. 2) output so that the display indication would be essentially proportional to battery charge. With reference to FIG. 6 the controlled impedance controller 44 (FIG. 2) output at junction 103 is summed with an offset current controlable by potentiometer 107 and allowed to flow through mutually exclusive switches 108 and 109. Switch 108 is closed for a duration determined by a variable duty cycle timer circuit comprising an integrator with amplifier 110 and capacitor 111, an inverter amplifier 112, switch 113 and timer 114. The timer circuit is in this case a standard 555 triggered time circuit whose output at junction 115 is high for a duration controlled by the integrator 110 output voltage. The integrator 110 input currents are the sum of the signal current through switch 108 and a scaling current controlled by potentiometer 116. The integrator 110 output stays constant when the average signal current through switch 108 and the above scaling currents cancel each other. At this point the duration $\Delta T$ of closed switch 108 multiplied by the offset controlled impedance controller 44 (FIG. 2) current $I_{sig}$ must be equal to minus the scaling current $I_{sc}$ from potentiometer 116 multiplied by the period of timer 114. The above can be written in terms of magnitude $T \times I_{sc} = \Delta T \times I_{sig}$ or $\Delta T/T = I_{sc}/I_{sig}$ where T is the period of timer 114. This means that the duration $\Delta T$ is inversely proportional to $I_{sig}$ or to the equivalent device impedance. The duration ΔT is kept constant by the steady state operation of the timer circuit controlled by the negative feedback loop of switch 113, timer 114, switch 108, integrator 110 and inverter 112. Switch 113 ensures that negative feedback can always be established. The above timer circuit is conventional but has only to ensure that the trigger signal rate at junction 116 has the period T larger than the maximum required ΔT. In the present embodiment this signal is advantageously supplied by the signal controlling switch 32 (FIG. 4). When other device parameters affect the signal compensating currents may be supplied to input 117. In the present case of a Battery the above currents are derived from battery temperature measurements. Processing of ΔT/T proceeds through potentiometer 118 and resistor network 119, 120 and 121 and through a low pass active filter with amplifiers 122 and 123 adapted for sufficient attenuation at the timer 114 triggering frequency components. The output of the above filter is fed to display 107, which may be a voltmeter, and indicates in the present case battery charge.

Figure 7:
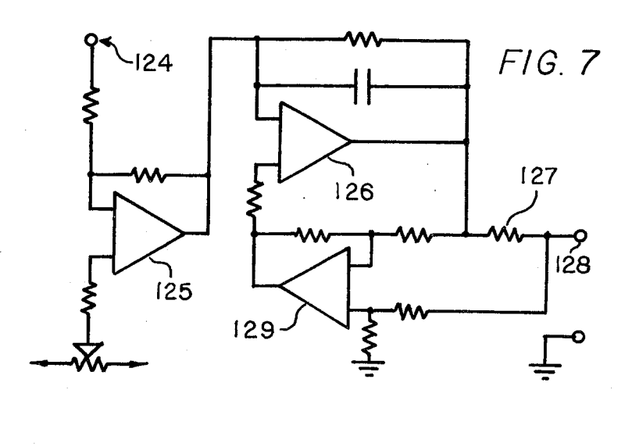
FIG. 7 is a circuit diagram of a controlled driver.

A circuit diagram of a driver 27 (FIG. 2) is shown in FIG. 7 where the controlled oscillator 41 (FIG. 2) output is fed to input point 124. The signal at input 124 is suitably amplified in amplifiers 125 and 126 and supplied through shunt resistor 127 to the device under test which is connected to output point 128. The current to the device under test which flows also through resistor 127 is made to follow the controlled oscillator 41 (FIG. 2) signal wave-form at point 124 by supplying the output of a difference amplifier 129 to the positive input of amplifier 126. At this positive input the signal is proportional to device test signal current since amplifier 129 is a difference amplifier transmitting the shunt resistor 127 voltage drop. At the negative input of amplifier 126, on the other hand, there is the signal waveform of controlled oscillator 41 (FIG. 2) In the stable feedback configuration of amplifiers 126 and 129 the positive and negative input signals of amplifier 126 must be virtually equal. It follows that the output current from point 128 into the device under test has virtually the same waveform as the input voltage at point 124. If the voltage at point 124 is held constant so is the current at point 128. Controlled driver 27 (FIG. 2) is therefore a virtual current source and presents negligible loading to the device under test. This makes for easy integration into an operating system 1 (FIG. 1).

A circuit diagram of a controlled oscillator 41 (FIG. 2) is shown in FIG. 8. The signal source is a VCO preferably with a sine wave output. The VCO shown in FIG. 8 is of type 8038 having a sine wave output at pin 8 and a square wave output at pin 9 at 90° phase shift with respect to the sine wave output. The VCO connection diagram is conventional with the exception of an additional duty cycle regulator circuit. The duty cycle has to be kept stable preferably at 50%, so that no spurious phase errors would appear at the controlled coherent detector 36 (FIG. 2) output, such a detector being sensitive to phase errors. This serves the useful purpose of maximizing the resolution and accuracy of device impedance measurements. The duty cycle regulation is accomplished by letting two mutually exclusive switches 130 and 131 alternately supply currents of opposite sign to an integrator comprising amplifier 132 and capacitor 133. The output of the integrator is steady when the above currents of opposite sign have equal magnitude on the average. Switches 130 and 131 are operated by the square wave output signal of VCO 134. When the VCO duty cycle is 50% the duty cycle of each of the switches 130 and 131 is also 50%. It follows that the above integrator output is steady when the above currents of opposite sign are of equal magnitude. When the above currents have magnitude ratios not at 50%/the duty cycle with steady integrator output has a correspondingly different value. Potentiometer 135 is used to control the above currents ratio and consequently also the duty cycle with steady integrator output. A sample and hold circuit comprising a differentiating capacitor 136, a switch and a capacitor 138 transmits the integrator output to capacitor 138 during a very short time following the crossover between switches 130 and 131. This ensures that the voltage across capacitor 138 is steady essentially all the time. This serves the useful purpose of minimizing waveform distortion of the VCO 134 output. This is also an object of this invention since waveform distortion affects the accuracy of phase detection in the coherent detection process employed. Duty cycle regulation is finally accomplished by transmitting the capacitor 138 voltage to the VCO 134 balancing inputs through follower amplifier 139 and inverter amplifier 140. This closes a stable feedback loop that keeps the duty cycle, as set by potentiometer 135, constant. The reference point of amplifier 140 is connected to the VCO 134 supply to serve the useful purpose of ensuring balanced driving signals, in push pull, through resistors 141 and 142. This, again, minimizes distortion in the sine wave output of VCO 134 at output point 143. The square wave output of VCO 134 is transmitted through output point 144. Input point 145 accepts conttrol signals from controller 52 (FIG. 2).

Figure 10:
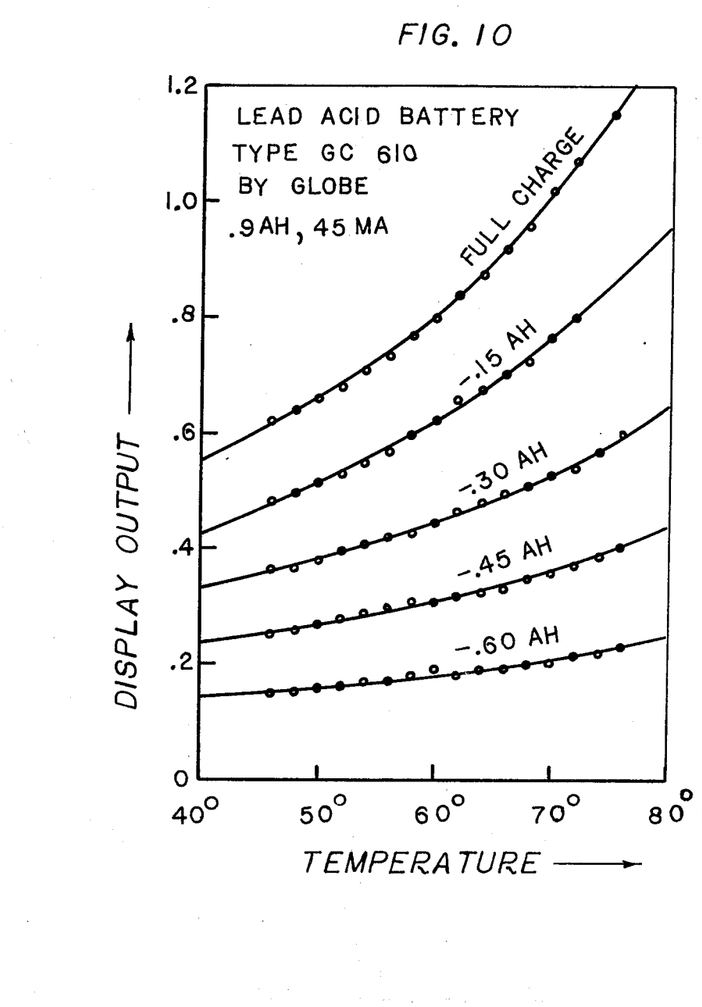
FIG. 10 is a plot of a display output versus temperature with battery state of charge as parameter.
Figure 11:
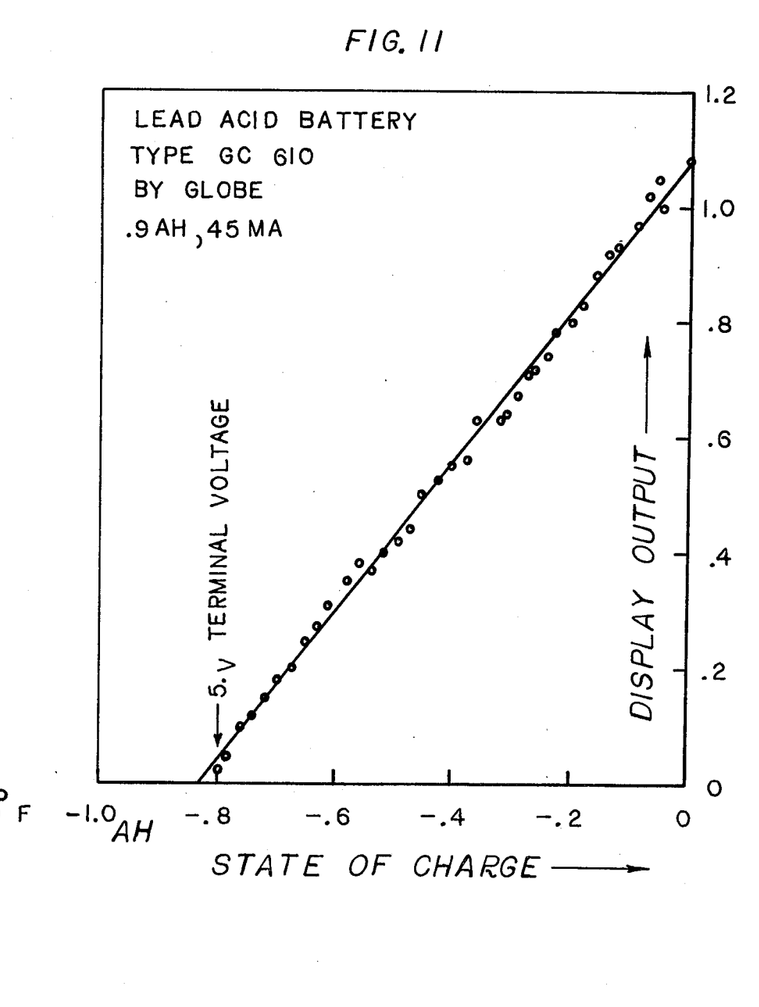
FIG. 11 is a calibration plot of a display output versus battery state of charge for a constant temperature.

A circuit diagram of controller 52 (FIG. 2) is shown in FIG. 9. Since most of the processing functions are performed within the circuits described above the controller 52 (FIG. 2) circuit is very simple in this case. A square wave generator 146 serves as clock and establishes essentially two phases of operation. A signal amplifying and processing phase and an automatic error correcting and stabilizing phase. The details of the operations within the above phases have already been described above. The output of square wave generator 146 at point 147 is supplied to input 148 (FIG. 3), to input 149 (FIG. 4) and to input 150 (FIG. 6). Within the controller, the above square wave output is combined logically with the controlled oscillator 41 (FIG. 2) square wave output at point 144 (FIG. 8) connected to input point 151 (FIG. 9). The logical result is high when the output at point 147 is low and when the controlled oscillator 41 (FIG. 2) square wave output at point 144 (FIG. 8) is high. The result is supplied, through point 152 (FIG. 9), to point 153 (FIG. 5) of controlled impedance controller 44 (FIG. 2). The leads 26 (FIG. 2) of thermister thermometer 24 (FIG. 2) are connected to points 154 (FIG. 9) to form a bridge network the output of which at point 155 (FIG. 9), through a temperature compensation network, is connected to point 117 (FIG. 6) of controlled display 106 (FIG. 2). The above bridge output compensates for temperature variations in the battery. In FIG. 9 there is also shown an inverter amplifier 156 with a switch 157. The input of the above inverter at point 158 is connected to the output of coherent detector 36 (FIG. 2) at point 159. With reference now to FIG. 4 the voltage at point 159 is constant only when the signal current from controlled signal amplifier 28 (FIG. 2) flowing into point 160 is equal and opposite to the controlled impedance controller 44 (FIG. 2)

output current flowing through point 161. Any deviation in either of the above currents would appear as a ramp voltage at point 159 (FIG. 4) and consequently also at the output of inverter amplifier 156 (FIG. 9) which is connected via switch 157 (FIG. 9) to point 162 (FIG. 9). The above ramp voltage is transmitted from point 162 (FIG. 9) to point 145 (FIG. 8) leading to the frequency control pin of VCO 134 (FIG. 8). The existance of a ramp voltage at the above control pin means a corresponding ramp in the frequency. Since the VCO frequency affects both the battery impedance and the controlled impedance controller 44 (FIG. 2) output the above mentioned deviations that caused the above ramp or drift in frequency will be corrected provided switch 157 is at the proper position. The operation frequency of VCO 134 (FIG. 8) is therefore automatically regulated so that the device impedance is always equivalent to the controlled impedance controller 44 (FIG. 2) output. Measurements of battery impedances were conducted with instrumentation built according to this specification. The measured impedances were plotted versus frequency as a family of curves with state of charge (independently determined) as parameter. The resulting empirical curves showed considerable variations in slope with strong curvatures and inflection points. The operating points of a charge measuring system with a linear display 106 (FIG. 2) output versus state of charge should therefore lie on a curve with variations in slope and curvatures corresponding to those of the above empirical curves. This can be implemented in controlled impedance controller 44 (FIG. 2) as described above in this specification. Virtually any dependence of the controlled impedance controller 44 (FIG. 2) outputs on frequency can be used to obtain a corresponding calibration curve, i.e. a display output versus state of charge. This flexibility in the method of obtaining a wide range of calibration curves is an important object of this invention. The only limitation on the above frequency dependence of the controlled impedance controller output is that its slope versus frequency cannot be infinite. The above slope can, however, be very steep allowing for virtually no frequency change over the entire state of charge range. The sign of the above slope can be either positive or negative since stability can always be assured by changing the position of switch 157 (FIG. 9). Other objects of this invention are accomplished by the abily to operate at any advantageous frequency range and to avoid double valued readings by bending the controlled impedance controller output versus frequency curve so that a desired, single valued, calibration curve is obtained. Measurements with the instrumentation built and adjusted according to this specification have yielded well behaved calibration curves of display output versus temperature. This is shown in FIG. 10. FIG. 11 is a demonstration that a linear calibration curve of display indication versus battery state of charge is obtainable and was in fact measured with the present method and instrumentation.

The embodiment just described employs independent temperature measurement, as an aid, to obtain the state of charge of a battery. This option is not always available. The basic problem of eliminating parameters such as internal temperature can then be handled as described in this specification in another embodiment. The circuits that were described above in detail could then be simplified by allowing more of the processing to be done by the controller computer rather than by hardware circuit elements. However, this simplification need not go beyond the basic switched control features described above since these are well adapted to integration in large systems and to the implementation of various muliplexing schemes.

While specific embodiments and advantages have been discussed in the foregoing various modifications will appear or suggest themselves to those skilled in the art.

I claim:

1. Instrumentation for the measurement of parameters of a system device, when information about the values of said parameters is partially known, as stored characteristic functions and data, comprising
   controlled oscillator means for generating controlled signals;
   controlled driver means for amplifying said controlled signals of said controlled oscillator means for converting said signals to test signals for exciting said system device;
   controlled signal amplifier means for amplifying responses of said device to said test signals;
   controlled impedance controller means for generating output signals equivalent to impedances of said device, said controlled impedance controller means receiving reference signals from said controlled oscillator means;
   controlled coherent detector means for detecting differences between said responses of said device to said test signals and said equivalent output signals of said controlled impedance controller means, said controlled coherent detector means receiving reference signals from said controlled oscillator means;
   controller means for steering said test signals to said device, steering said response signals in said controlled signal amplifier means, steering said responses of said device and said equivalent outputs of said controlled impedance controller means to said controlled coherent detector means, steering said detected differences of said controlled coherent detector means to said controller means, processing and converting said differences in said controlled coherent detector means to control signals for controlling said controlled impedance controller means and said controlled oscillator means for making said output signals of said controlled impedance controller means equivalent to impedances of said device, processing said equivalent output signals of said controlled impedance controller means, generating additional signals, controlling said controlled oscillator means and, storing characteristic functions of said device; and
   controlled display means for receiving and processing said processed equivalent output signals of said controlled impedance controller means, receiving and processing said equivalent output signals of said controlled impedance controller means, obtaining, displaying and transmitting values of parameters of said device.

2. The instrumentation of claim 1 wherein said device is a multiplicity of devices.

3. The instrumentation of claim 1 wherein said processing of said equivalent output signals of said controlled impedance controller means comprises
   stepping the frequency of said controlled oscillator means, comparing said response signals of said device to said stored characteristic functions, searching for said stored characteristic function that best fits said response signals of said device and assigning parameter values of said characteristic function of best fit to said device.

4. The instrumentation of claim 3 wherein said device is a multiplicity of devices.

5. The instrumentation of claim 3 wherein said search for best fit comprises computing correlation values between said stored characteristic functions and said response signals of said device, searching for the characteristic function with the maximum of said correlation values, said maximum value being approximately equal to the correlation value of said response signals with themselves, and assigning parameter values, of said characteristic function with maximum correlation value, to said device.

6. The instrumentation of claim 5 wherein said device is a multiplicity of devices.

7. The instrumentation of claim 5 wherein said search for best fit comprises selecting N+1 characteristic functions in the neighborhood of said characteristic function with said maximum correlations value where N is the total number of parameters of said device, interpolating the values of parameters of said device by solving a system of N+1 second order equations, by reduction to N linear equations, and assigning said interpolated values of said parameters to said device.

8. The instrumentation of claim 7 wherein said device is a multiplicity of devices processed independently.

9. The instrumentation of claim 7 wherein the number of said selected characteristic functions is larger than N+1 comprising determining said values of parameters of said device by regression analysis.

10. Instrumentation for the measurement of parameters of a system device, where information about the values of said parameters is partially known, comprising controlled oscillator means for generating controlled signals;

controlled driver means for amplifying said controlled signals of said oscillator means and for converting said controlled signals to test signals for exciting said device;

controlled signal amplifier means for amplifying responses of said device to said test signals;

controlled impedance controller means for generating output signals equivalent to said responses of said device, said controlled impedance controller means receiving reference signals from said controlled oscillator means;

controlled coherent detector means for detecting differences between said responses of said device and said output signals of said controlled impedance controller, said controlled coherent detector receiving reference signals from said controlled oscillator means;

controller means for steering said test signals to said device, steering said responses of said device to said controlled signal amplifier means, steering the output of said controlled signal amplifier means and said output signals of said controlled impedance controller means to said controlled coherent detector means, steering detected differences of said controlled coherent detector means to said controller means, processing and converting said differences of said controlled coherent detector means to control signals for controlling said controlled impedance controller means, controlling said controlled oscillator means and making said output signals of said controlled impedance controller means equivalent to said responses of said device, generating compensating control signals, controlling said controlled oscillator means and storing characteristic functions of said device; and controlled display means for receiving said equivalent output signals of said controlled impedance controller means, receiving said compensating control signals of said controller means, processing said received equivalent output signals and said compensating control signals, obtaining, displaying and transmitting values of parameters of said system device.

11. The instrumentation of claim 10 wherein said device is a multiplicity of devices processed independently.

12. The instrumentation of claim 11 wherein said controlled oscillator means comprises VCO means including duty cycle control inputs, first and second switching means (130,131) modulated by said VCO output, and first control means (135) for generating two controllable opposing currents, integrating means for detecting differences between said opposing currents, sample and hold means for storing said detected differences, push pull means for generating balanced equivalents of said difference between said opposing currents and for applying said differences to said duty cycle control inputs of said VCO means, said VCO means generating output signals with controllable relative phase;

said controlled driver means comprises a voltage to current transforming means for driving test signals into said system device from a high impedance source;

said controlled signal amplifier means comprises third and fourth switching means (31, 32) for amplifying said response signals of said system device during a first clocking phase and shutting off said response signals during a second clocking phase;

said controlled impedance controller means comprises
 (a) second control means (59) and fifth switching means (60) for generating a zeroth order signal modulated by output signals of said controlled oscillator, means,
 (b) third control means (64) and sixth and seventh switching means (65, 69) feeding a first differentiating means (67, 68) for generating a first order signal modulated by output signals of said controlled oscillator means,
 (c) fourth control means (71) and eighth and ninth switching means (72, 75) feeding a second differentiating means (74, 80) for generating a second order signal, said second order signal being applied, through a first resistor (80), to an averaging amplifier (77), the output of said averaging amplifier being applied, through a second resistor (105), to an inverting means (182), the output of said inverting means being applied to a tenth switching means (84) and, through said tenth switching means, to eleventh switching means (85), said tenth and eleventh switching means being modulated by the polarity of the output of said averaging amplifier resulting in a unipolar first order signal which is applied to a first order generating means (89,90,91,92,93) producing a combination of first order and second order signals modulated by output signals of said controlled oscillator means;

said controlled coherent detector means comprises twelfth switching means (37) modulated by output signals from said controlled oscillator means for detecting said amplified response signals of said controlled signal amplifier means, integrator means (40, 43) for detecting said said difference between said detected response signals of said controlled signal amplifier means and said equivalent output signals from said controlled impedance controller means, sample and hold means (53,54,55) for transmitting steady levels of said difference between said detected response signals of said controlled signal amplifier means and said output signals of said controlled impedance controller means, further sample and hold means (57,58) for transmitting said steady levels during said second clocking phase, wherein said steady levels transmitted by said further sample and hold means are used as a reference signal to be applied to an automatic leakage compensator means, said compensator means comprising thirteenth switching means (48) activated during said second clocking phase, an integrator means (49,50), and amplifier means (46), said controlled display means comprises offset means (107) means for summing said equivalent output signals of said controlled impedance controller means with the output of said offset means, fourteenth switching means (108) for modulating the output of the summing means, further offset means (116) for generating offset current ($I_s$), still further integrator means (110,111) and inverter means (112) for detecting the difference between said offset current and said modulated sum, fifteenth switch means (113) for applying said detected difference to a pulse width control input of a timer means (114) for modulating said fourteenth switching means (108) and a further averaging amplifier (122,123) connected as a low pass filter for transforming the pulse width at the input of the timing means to a voltage equivalent of a parameter of said system device;

and said controller means comprises square wave generator means (146) for generating clock signals, an inverting amplifier (156) and sixteenth switch means (157) for automatically regulating the frequency of said VCO.

13. The instrumentation of claim 12 wherein said device is a multiplicity of devices processed independently.

14. The instrumentation of claim 12 wherein said controller means is eliminated by a temperature eliminating comprising a temperature sensor and a compensation network (163).

15. The instrumentation of claim 14 wherein said device is a battery.

16. Method for the measurement of parameters of system devices, when information about the values of said parameters is partially known, as stored characteristic functions and data, comprising:

generating controlled signals;

amplifying said controlled signals, converting said amplified controlled signals to test signals for exciting said system devices;

amplifying controlled responses of said devices to said test signals;

generating controlled output signals equivalent to impedances of said system devices;

detecting differences, coherent with said controlled signals, between said controlled responses and said controlled output signals;

processing said differences for converting to control signals for making said controlled output signals equivalent to impedances of said system devices;

storing characteristic functions of said system devices;

obtaining values of parameters of said system devices by using said equivalent output signals and said stored characteristic functions; and displaying said values of said parameters of said system devices.

17. The method of claim 16 wherein said processing of said equivalent output signals comprises stepping the frequency of said generated controlled signals, comparing said response signals to said stored characteristic functions that best fit said response signals and assigning parameter values of said characteristic functions of best fit to said devices.

18. The method of claim 17 wherein said search for best fit comprises computing correlation values between said stored characteristic functions and said response signals of each device, searching for a characteristic function with a maximum of said correlation values, said maximum correlation value being approximately equal to correlation value of said response signals with themselves, and assigning parameter values, of said characteristic function with maximum correlation value, to said device.

19. The method of claim 18 wherein said search for best fit comprises selecting N+1 characteristic functions with the next highest correlation values to said maximum correlation value where N is the total number of parameters of said device, interpolating the values of parameters of said device by solving a system of N+1 second order equations, by reduction to N linear equations, and assigning said interpolated values of said parameters to said device.

20. The method of claim 19 wherein the number of said selected characteristic functions is larger than N+1 comprising determining said values of parameters of said device by regression analysis.

* * * * *